(12) United States Patent
Ueda et al.

(10) Patent No.: US 6,916,552 B2
(45) Date of Patent: Jul. 12, 2005

(54) ORGANIC ELECTROLUMINESCENT DEVICE AND DISPLAY UNIT

(75) Inventors: Naoyuki Ueda, Kanagawa (JP);
Ichinori Takada, Kanagawa (JP);
Tetsuo Shibanuma, Kanagawa (JP);
Mari Ichimura, Kanagawa (JP);
Shinichiro Tamura, Kanagawa (JP)

(73) Assignee: Sony Corporation, Tokyo (JP)

( * ) Notice: Subject to any disclaimer, the term of this patent is extended or adjusted under 35 U.S.C. 154(b) by 126 days.

(21) Appl. No.: 10/068,353

(22) Filed: Feb. 6, 2002

(65) Prior Publication Data

US 2002/0122900 A1 Sep. 5, 2002

(30) Foreign Application Priority Data

Feb. 6, 2001 (JP) .................................... P2001-029533
Jan. 16, 2002 (JP) .................................... P2002-006851

(51) Int. Cl.[7] ............................. B32B 19/00; B32B 9/00; H01J 1/62; H01J 63/04; C09K 11/06; H01L 51/00
(52) U.S. Cl. ....................... 428/690; 428/917; 313/504; 313/506; 252/301.16; 257/40
(58) Field of Search ........................ 428/690; 429/917; 313/506, 504; 252/301.16; 257/40

(56) References Cited

U.S. PATENT DOCUMENTS 5,885,498 A * 3/1999 Matsuo et al. ............... 252/583
6,211,369 B1 * 4/2001 Salbeck et al. .............. 546/18
6,391,482 B1 * 5/2002 Matsuo et al. ............... 428/690
6,447,934 B1 * 9/2002 Suzuki et al. ............... 428/690

FOREIGN PATENT DOCUMENTS

JP 07-278537 10/1995
WO WO96/04687 2/1996

OTHER PUBLICATIONS

M. Matsuura, et al., "S11–2 Performance of RGS MultiColor Organic EL Display", Asia Display, 1995, pp. 269–270.

T. Yamada, et al., Current Status and Perspective of Active-type Organic EL Display, Electronic Display Forum 2000, Apr. 12–14, 2000, pp. 5–18 to 5–23.

J. Salbeck, et al., "Low molecular organic glasses for blue electroluminescence", Synthetic Metals 91 (1997) 2009–215.

J. Salbeck, et al., "Spiro Linked Compounds as Active Materials in Organic Light Emitting Diodes", Hoechst AG Corporate Research and Max–Planck–Institute for Polymer Research, pp. 349–350.

* cited by examiner

Primary Examiner—Camie S Thompson
(74) Attorney, Agent, or Firm—Sonnenschein, Nath & Rosenthal LLP

(57) ABSTRACT

An organic electroluminescent device capable of blue emission with a high color purity, and a display unit capable of full-color display with high color expressivity by using the organic electroluminescent device are provided. The organic electroluminescent device includes at least a hole transportation layer and a luminescent layer held between a lower electrode to become an anode and an upper electrode to become a cathode in a state of lamination in that order from the anode side. The luminescent layer is made of a spiro compound, and the hole transportation layer is made of triphenylamine tetramer. Furthermore, the display unit includes organic electroluminescent devices as blue-emitting elements arrayed for a plurality of pixels.

17 Claims, 8 Drawing Sheets

A: (0.16, 0.05)   a: (0.16, 0.19)
B: (0.15, 0.06)   b: (0.17, 0.17)
C: (0.15, 0.07)   c: (0.18, 0.15)
D: (0.16, 0.07)   d: (0.16, 0.13)
                  e: (0.16, 0.12)
                  f: (0.16, 0.11)
                  g: (0.16, 0.14)

ORGANIC ELECTROLUMINESCENT DEVICE AND DISPLAY UNIT

BACKGROUND OF THE INVENTION

The present application claims priority to Japanese Application(s) No(s). P2001-029533 filed Feb. 6, 2001, and P2002-006851 filed Jan. 16, 2002, which application(s) is/are incorporated herein by reference to the extent permitted by law.

1. Field of the Invention

The present invention relates to a spontaneous luminescence type organic electroluminescent device used as a display unit for a display unit, for example, a color display, and to a display unit using the organic electroluminescent device.

2. Description of the Related Art

In recent years, regarding multimedia-oriented products and other products, the interface between human and machine has become more important. In order to efficiently operate the machine, adequate amount of information must be concisely and instantaneously retrieved from the machine with no error. Therefore, research has been made relative to displays and other various display units.

Accompanying miniaturization of machines, requirements for miniaturized and low-profile display units have become more intensified day by day. Under these circumstances, regarding most laptop information processing devices and other miniaturized products, for example, miniature televisions, watches, and desk calculators, liquid crystal displays have been used as the interfaces thereof.

The liquid crystal display has been researched almost exclusively as an essential interface for display units from miniaturized to large-capacity taking advantage of the characteristics of the liquid crystal, that is, low-voltage drive and low power consumption.

However, since the liquid crystal display is of photoreceptive type, backlight is indispensable, and an electric power required for driving the backlight is larger than that for the liquid crystal. Consequently, there is a limitation in power supply even though a storage battery is built in and, therefore, a problem of restriction in the use, for example, reduction of uptime, may occur.

Furthermore, since liquid crystal display is the display based on the status of orientation of the liquid crystal molecule, contrast varies depending on angles even within the viewing angle thereof. Consequently, the viewing angle is reduced and, therefore, the liquid crystal display is not suitable for a large display, etc. In addition, since the orientation speed of the liquid crystal display is low, it is not suitable for displaying moving images.

On the other hand, from the viewpoint of drive system, although an active matrix system of the liquid crystal display exhibits an adequate response speed for handling moving images, since a TFT driving circuit is used, it is difficult to increase a screen size because of pixel defect, and it is inadvisable from the viewpoint of cost reduction as well. Regarding a passive matrix system that is another drive system, the cost is low, and it is relatively easy to increase the screen size in a manner opposite to that of the active matrix system. However, it cannot exhibit an adequate response speed for handling moving images.

Aside from such a liquid crystal display unit, display units using spontaneous luminescence type elements, for example, plasma display elements, inorganic electroluminescent devices, and organic electroluminescent devices, have been researched.

Among these, the plasma display element uses plasma emission in gas for display, and is suitable for an increase in size and increase in capacity. However, since there are problems in reduction of thickness and cost, and high-voltage bias is required for driving, it is not suitable for portable devices.

Regarding the inorganic electroluminescent device, although a green-emitting display, etc., were commercialized, since a few hundred voltages were required for alternating current bias drive similarly to the plasma display element, they were not accepted by users. Although emission of the primary colors RGB required for a color display has achieved success as a result of advance in technique after that, since inorganic materials are indispensable in the configuration, control of emission wavelength, etc., by molecular design, etc., is impossible and, therefore, it is expected that full colorization will be attended with difficulties.

On the other hand, the organic electroluminescent device uses electroluminescence due to an organic compound. This phenomenon was already discovered about thirty-odd years ago from now. That is, in the first half of the 1960s, when a carrier was injected into an anthracene single crystal which exhibited an intense fluorescence, occurrence of specific emission phenomenon (due to induction of luminescence) was observed. Since then, the organic electroluminescent device was the focus of study for a long time. However, at any rate, since it had low brightness and monochrome, and a single crystal was used, technological emphasis was primarily laid on the carrier injection into the organic material and, therefore, it still remained in the realm of the stage of basic study.

However, in 1987, Tang et al. of Eastman Kodak Company disclosed an organic electroluminescent device having a laminated structure including an amorphous luminescent layer capable of low-voltage drive and high-brightness luminescence. Since then, considerable research has been made until now in various areas regarding luminescence, stability, increase in brightness, laminated structure, and manufacturing method related to the primary colors RGB.

Herein, in order to realize the full-color display, stable RGB luminescent elements with high color purity are indispensable. For this reason, in the area of the organic electroluminescent device as well, considerable research and development have been made regarding luminescent materials and elements having a chromaticity based on NTSC (National Television System Committee) standard or sRGB (Standard RGB).

However, no blue-emitting material and element satisfying the blue chromaticity (0.14, 0.07) based on the NTSC standard or blue chromaticity (0.15, 0.06) based on the sRGB have been achieved.

For example, although Hosokawa et al. disclosed a blue-emitting organic electroluminescent device (hereafter referred to as blue-emitting element) using a DPVBi-based material in the literature "Asia Display'95, 269, (1995)", as indicated by the point a in the CIE chromaticity diagram shown in FIG. 2, the chromaticity of this blue-emitting element is on the order of a(0.16, 0.19). The chromaticity range based on the sRGB is also shown in the chromaticity diagram.

In October, 2000, SANYO Electric Co., Ltd. disclosed an active matrix TFT full-color display of 5.5 inches. The chromaticity of the blue pixel thereof is b(0.17, 0.17) as indicated by the point b in FIG. 2.

It is known that the stability of the film structure of an organic thin film constituting the element is important for the stability and durability of an organic electroluminescent device. Usually, since the organic thin film is formed in an amorphous state, it can be said that a material capable of stably maintaining the amorphous state, that is, the material having a high glass transition temperature (Tg), is superior heat-resistant material. As the method for improving the Tg of the material constituting the organic thin film, a method, in which a cohesive force between molecules is reduced, and crystallinity is reduced by introducing a branch or nonplanar property in the molecular structure of compound, is adopted. Typical examples thereof include a compound having a starburst structure or spiro structure.

In particular, the spiro structure is a remarkably nonplanar molecular structure and, therefore, a material having high heat resistance can be developed. From such a viewpoint, Hoechst AG suggested a compound including the spiro structure which reduces cohesive force between molecules and reduces crystallinity by introducing a branch or nonplanar property in the molecular structure of compound (refer to a literature "Polymer Preprints38 (1997) 349"). In Japanese Unexamined Patent Application Publication No. 7-278537, it is described that an organic electroluminescent device using 2,2',7,7'-tetrakis(biphenyl)-9,9'-spirobifluorene which is a compound having such a Spiro structure exhibits blue emission. In a literature "Synthetic Metals91, 209 (1997)", it is reported that the chromaticity of an element using this compound as a material is c(0.18, 0.15) indicated by the point c shown in FIG. 2.

In addition to these, there is a description regarding an organic electroluminescent device using 2,2',7,7'-tetrakis (biphenyl)-9,9'-spirobifluorene having the spiro structure and Alq3 in International Patent Application PCT/JP95/01539. This organic electroluminescent device is a green-emitting element using this spiro compound as a hole transportation material and using Alq3 as a luminescent layer.

As described above, although considerable research and development have been made regarding stable luminescent materials and elements emitting each RGB color with a high color purity in order to realize a full-color display, especially, the chromaticity of blue-emitting material and element is inadequate, and no luminescent element described above has satisfied the blue chromaticity (0.14, 0.07) based on the NTSC standard or blue chromaticity (0.15, 0.06) based on the sRGB.

Consequently, regarding the display unit using the organic electroluminescent device, it has been difficult to realize full-color display with high color expressivity.

SUMMARY OF THE INVENTION

Accordingly, it is an object of the present invention to provide an organic electroluminescent device capable of stable blue emission with a high color purity very close to blue color based on the NTSC standard and sRGB, and to provide a display unit capable of full-color display with high color expressivity by using the organic electroluminescent device.

In order to achieve the aforementioned object, an organic electroluminescent device according to an aspect of the present invention includes at least a hole transportation layer and a luminescent layer held between an anode and a cathode in a state of lamination in that order from the anode side, wherein the luminescent layer is made of a spiro compound represented by the following Structural formula (1) or a derivative thereof, and the hole transportation layer is made of triphenylamine tetramer or a derivative thereof.

Structural formula (1)

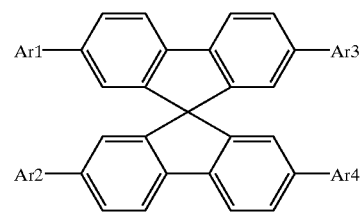

where Ar1 to Ar4 in the Structural formula (1) independently represent a biphenyl group or substituted biphenyl group represented by the following Structural formula (4), a naphthyl group or substituted naphthyl group represented by the following Structural formula (5) or Structural formula (6), an anthryl group or substituted anthryl group represented by the following Structural formula (7), Structural formula (8), or Structural formula (9). Ar1 to Ar4 may be the same group or may be a plurality of different groups.

Structural formula (4)

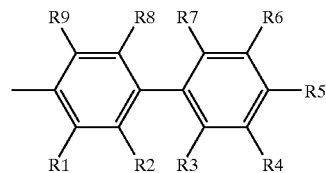

Structural formula (5)

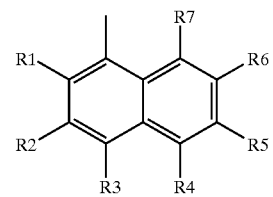

Structural formula (6)

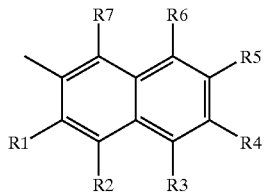

Structural formula (9)

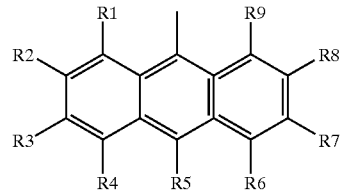

Structural formula (7)

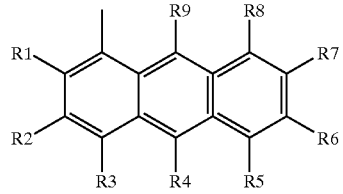

Structural formula (8)

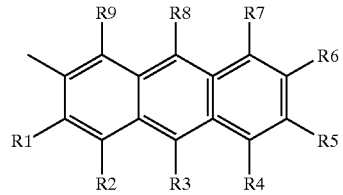

where R1 to R9 in the Structural formulae (4) to (9) may be the same one or may be a plurality of different ones, and independently represent hydrogen, alkyl group having the number of carbon atoms of 1 to 12, cycloalkyl group, aryl group having the number of carbon atoms of 5 to 28, or substituted aryl group.

The aforementioned substituent may substitute for hydrogen of phenyl group portion of a spiro structure which becomes a primary skeleton of the Structural formula (1). However, in particular, when constituents of the R1 to R9 and the Spiro structure portion are other than hydrogen, the substitution rate thereof is controlled to the extent that these materials can be made into the form of a film having a predetermined film thickness by a film making method, for example, a vapor deposition method and a spin coating method.

Triphenylamine tetramer constituting the hole transportation layer is specified to be a compound represented by the following Structural formula (2) or Structural formula (3), or a derivative thereof.

Structural formula (2)

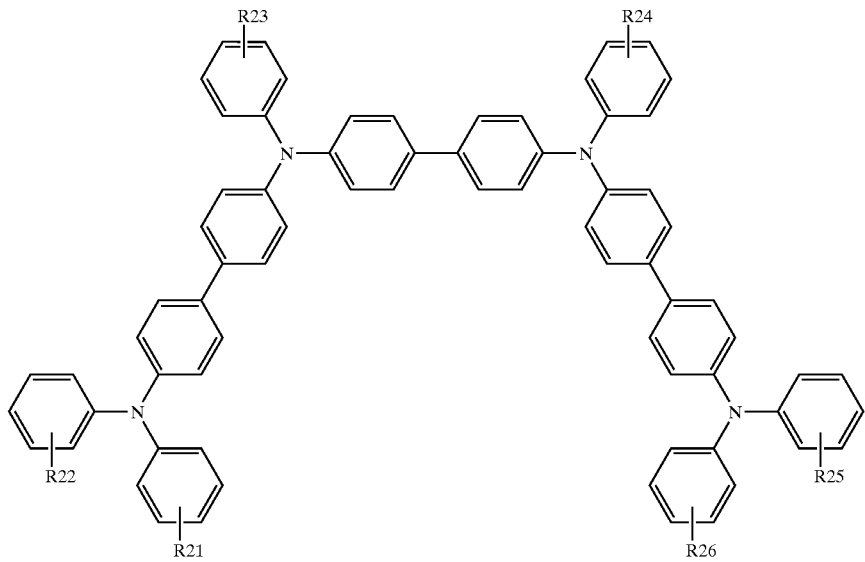

-continued

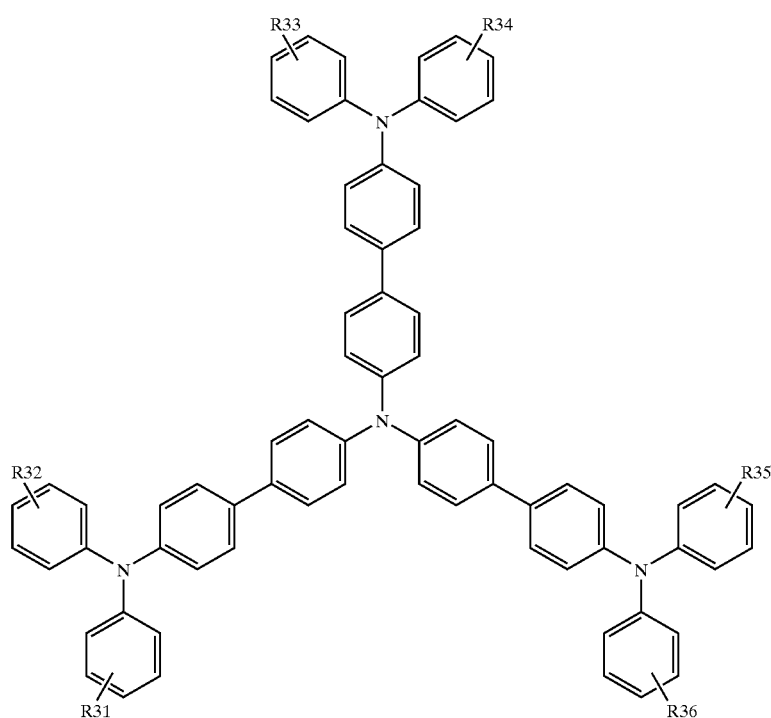

Structural formula (3)

R21 to R26 in the Structural formula (2) and R31 to R36 in the Structural formula (3) independently represent hydrogen, alkyl group having the number of carbon atoms of 1 to 12, cycloalkyl group, aryl group having the number of carbon atoms of 5 to 28, or substituted aryl group. The substituted aryl group is specified to be a group in which a hydrocarbon group, for example, an alkyl group and cycloalkyl group, has substituted for a part of the aryl group.

R21 to R26 in the Structural formula (2) may be the same one or may be a plurality of different ones, and likewise, R31 to R36 in the Structural formula (3) may be the same one or may be a plurality of different ones. Furthermore, R21 to R26 in the Structural formula (2) and R31 to R36 in the Structural formula (3) are expressed in such a manner that one substituent is bonded to each phenyl group constituting the primary skeleton of triphenylamine tetramer. However, a plurality of different constituents other than hydrogen may be bonded to each phenyl group in the Structural formula (1) and Structural formula (2) within the range of five constituents or less. When R21 to R26 in the Structural formula (2) and R31 to R36 in the Structural formula (3) are other than hydrogen, the substitution rate thereof is controlled to the extent that these materials can be made into the form of a film having a predetermined film thickness by a film making method, for example, a vapor deposition method and a spin coating method.

Regarding the organic electroluminescent device having such a configuration, since materials represented by the aforementioned Structural formulae (1) to (9) are used in combination as the hole transportation layer and luminescent layer, high purity blue emission can be achieved, wherein the peak wavelength of emission spectrum is 420 nm to 450 nm, the full width at half maximum of the peak of emission spectrum is 40 to 70 nm, and the emission color is (0.15±0.01, 0.06±0.01) in the CIE chromaticity diagram and, therefore, is very close to the blue chromaticity (0.14, 0.07) based on the NTSC standard and blue chromaticity (0.15, 0.06) based on the sRGB.

In this organic electroluminescent device, an electron transportation layer may be provided between the cathode and the luminescent layer. By providing the electron transportation layer in addition to the luminescent layer, as described above, blue emission with high color purity can be achieved in spite of low brightness luminescence. Consequently, as an effect thereof, reduction of driving voltage and extension of life span can also be achieved.

A display unit according to another aspect of the present invention uses the aforementioned organic electroluminescent device as a blue-emitting element.

As described above, such a display unit uses the organic electroluminescent device, which emits blue light with high color purity, as the blue-emitting element. Therefore, full-color display with high color expressivity can be realized by combining the blue-emitting element with other red-emitting element and green-emitting element.

DESCRIPTION OF THE PREFERRED EMBODIMENTS

Figure 1:
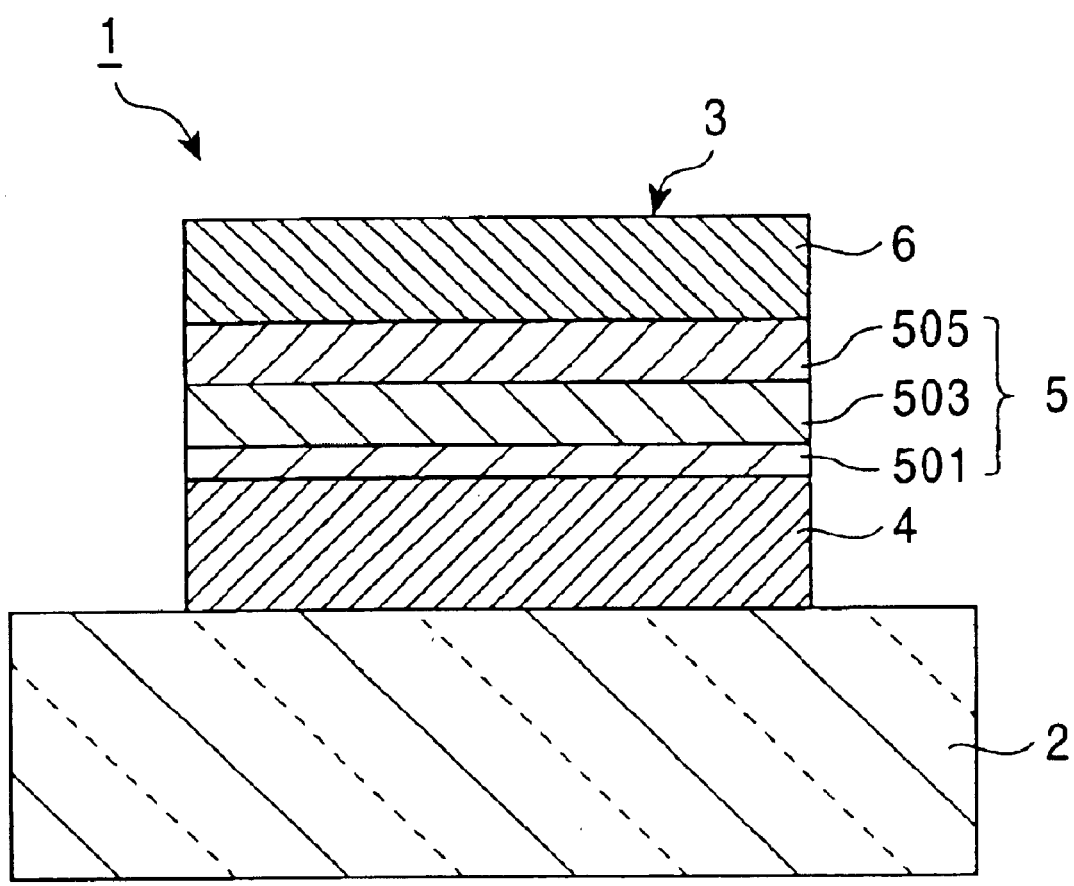
FIG. 1 is a schematic sectional view of a configuration of an organic electroluminescent device and a display unit according to the present invention.

The configuration of an organic electroluminescent device and a display unit using the same according to the present invention will be described below in detail with reference to the drawing. FIG. 1 is a schematic sectional view of the organic electroluminescent device and the display unit using the same according to the present invention.

A display unit 1 shown in this drawing includes a substrate 2 and an organic electroluminescent device 3 provided on the substrate 2. The organic electroluminescent device 3 has a configuration in which a lower electrode 4, an organic layer 5, and an upper electrode 6 are laminated in that order on the substrate 2, and emitted light h is taken out of the substrate 2 side or the upper electrode 6 side. Although this drawing shows a configuration in which the organic electroluminescent device 3 for one pixel is provided on the substrate 2, the display unit 1 is specified to include a plurality of pixels, and a plurality of organic electroluminescent devices 3 are arrayed for respective pixels.

Next, a detailed configuration of each part constituting the display unit 1 will be described in order of the substrate 2, lower electrode 4 and upper electrode 6, and organic layer 5.

The substrate 2 is made of glass, silicon, plastic substrate, TFT substrate in which TFT (thin film transistor) is formed, or the like. In particular, when the display unit 1 is of transmission type which takes out emitted light h from the substrate 2 side, the substrate 2 is composed of a material having translucency.

The lower electrode 4 formed on the substrate 2 is used as an anode or cathode. In the drawing, the case where the lower electrode 4 is the anode is shown as a typical example.

The lower electrode 4 has been patterned into a shape suitable for the drive system of the display unit 1. For example, when the drive system of the display unit 1 is of passive matrix type, the lower electrode 4 is formed into the shape of, for example, stripe. When the drive system of the display unit 1 is of active matrix type in which each pixel is provided with the TFT, the lower electrode 4 is patterned in accordance with each of the pixels being in multiple array, and is formed in such a manner as to connect to each TFT provided likewise relative to each pixel with a contact hole (not shown in the drawing) formed in an interlayer insulation film covering the TFT therebetween.

On the other hand, the upper electrode 6 provided on the lower electrode 4 with the organic layer 5 therebetween is used as a cathode when the lower electrode 4 is an anode, and is used as the anode when the lower electrode 4 is the cathode. In the drawing, the case where the upper electrode 6 is the cathode is shown.

When the display unit 1 is of passive matrix type, the upper electrode 6 is formed into, for example, the shape of stripe intersecting the stripe of the lower electrode 4, and the portions where these are intersected and laminated becomes the organic electroluminescent devices 3. When the display unit 1 is of active matrix type, the upper electrode 6 is formed into the shape of a solid film made in such a manner as to cover one face of the substrate 2, and is used as a common electrode for the pixels. When the active matrix type drive system is adopted for the display unit 1, in order to further improve the open area ratio of the organic electroluminescent device 3, a top face emission type, in which the emitted light is taken out of the upper electrode 6 side, is adopted preferably.

Herein, as the anode material constituting the lower electrode 4 (or upper electrode 6), those having a work function as large as possible are desirable. Preferable examples thereof include, for example, Ni, gold, platinum, palladium, selenium, rhodium, ruthenium, iridium, rhenium, tungsten, molybdenum, chromium, tantalum, and niobium, alloys thereof, tin oxide, indium tin oxide (ITO), zinc oxide, and titanium oxide.

On the other hand, as the cathode material constituting the upper electrode 6 (or lower electrode 4), those having a work function as small as possible are desirable. Preferable examples thereof include, for example, magnesium, calcium, indium, lithium, aluminum, and silver, and alloys thereof.

An electrode at the side, from which the emitted light generated in the organic electroluminescent device 3 is taken out, uses a material having translucency and appropriately selected from the aforementioned materials. In particular, the material capable of transmitting 30% or more of the light in the region of the wavelength of the emitted light in the organic electroluminescent device 3 is used preferably.

For example, when the display unit 1 is of transmission type in which the emitted light is taken out of the substrate 2 side, an anode material having translucency, such as ITO, is used for the lower electrode 4 to become the anode, and a cathode material having an excellent reflectance, such as aluminum, is used for the upper electrode 6 to become the cathode.

On the other hand, when the display unit 1 is of top face emission type in which the emitted light h is taken out of the upper electrode 6 side, an anode material, such as chromium, is used for the lower electrode 4 to become the anode, and a cathode material having translucency, such as a compound of magnesium and silver (MgAg), is used for the upper electrode 6 to become the cathode. However, since MgAg has a light transmittance on the order of 30% in the region of blue wavelength, the organic layer 5 described below is preferably designed in order that a resonator structure is optimized and the intensity of the light taken out is increased.

The organic layer 5 is made by laminating a hole injection layer 501, hole transportation layer 503, and luminescent layer 505 in that order from the anode side (in the drawing, from the lower electrode 4 side).

A layer of or laminated layers of a material, for example, a conductive polymer, e.g., PPV (polyphenylenevinylene), copper phthalocyanine, and starburst type amine, can be used as the hole injection material constituting the hole injection layer 501.

As is a feature of the organic electroluminescent device 3, a hole transportation material constituting the hole transportation layer 503 is made of triphenylamine tetramer represented by the aforementioned Structural formula (2) or Structural formula (3), or a derivative thereof.

As is a further feature of the organic electroluminescent device 3, a luminescent material constituting the luminescent layer 505 is made of a spiro compound represented by the aforementioned Structural formula (1) and Structural formulae (4) to (9) or a derivative thereof. In the configuration of the present embodiment, the luminescent layer 505 using this luminescent material becomes a luminescent layer having a electron transportation property.

Although not shown in the drawing, an electron transportation layer may be provided between the luminescent layer 505 and the cathode (in the drawing, upper electrode 6) in addition to the luminescent layer 505. For example, Alq3 [tris(8-quinolinol) aluminum] can be appropriately used for this electron transportation layer.

Although not shown in the drawing, a buffer layer made of an alkali metal oxide, for example, lithium oxide, cesium oxide, or lithium fluoride, alkali metal fluoride, alkaline-earth metal oxide, or alkaline-earth metal fluoride may be inserted between the luminescent layer 505 and the cathode (in the drawing, upper electrode 6). Consequently, the efficiency of electron injection is improved and, therefore, this is a preferable configuration.

The formation of the organic layer 5 by the aforementioned organic materials can be performed using each organic material synthesized with a known method and applying a known method, for example, vacuum deposition and spin coating.

Although not shown in the drawing, in the display unit 1 provided with the organic electroluminescent device 3 having such a configuration, in order to prevent degradation of the organic electroluminescent device 3 due to water, oxygen, etc., in the atmosphere, it is desirable to form a sealing film made of magnesium fluoride or silicon nitride film on the substrate 2 in such a manner as to cover the organic electroluminescent device 3, or to cover the organic electroluminescent device 3 with a sealing can followed by purging a hollow portion with a dried inert gas or by evacuating.

Although not shown in the drawing, in the display unit 1 provided with the organic electroluminescent device 3 having such a configuration, the organic electroluminescent device 3 may be used as a blue-emitting element, and a red-emitting element and green-emitting element as well as the blue-emitting element may be provided at respective pixels. These three pixels may serve as subpixels and constitute one pixel. A plurality of pixels, each composed of a group of these three pixels, may be arrayed on the substrate 2 and, therefore, full-color display may be performed.

Regarding the organic electroluminescent device 3 having a configuration described above, since materials represented by the aforementioned Structural formulae (1) to (9) are used in combination as the hole transportation layer 503 and luminescent layer 505, high purity blue emission can be achieved, wherein the peak wavelength of emission spectrum is 420 nm to 450 nm, the full width at half maximum of the peak of emission spectrum is 30 to 70 nm, and the emission color is (0.15±0.01, 0.06±0.01) in the CIE chromaticity diagram and, therefore, is very close to the blue chromaticity (0.14, 0.07) based on the NTSC standard or blue chromaticity (0.15, 0.06) based on the sRGB.

Furthermore, regarding the aforementioned organic electroluminescent device 3, since the full width at half maximum of the peak of emission spectrum is 30 to 70 nm, high color purity can be achieved without an increase in purity of emission wavelength due to the interference effect, that is, without a decrease in the peak width of emission spectrum. Consequently, it is possible to achieve blue emission with high brightness effectively using the peak height of emission spectrum.

Therefore, the display unit 1 provided with the aforementioned organic electroluminescent device 3 can perform full-color display with high color expressivity by combining the organic electroluminescent device with red-emitting element and green-emitting element.

In addition, the organic electroluminescent device 3 uses the spiro compound for the luminescent layer 505, and uses triphenylamine tetramer for the hole transportation layer 503. Since these compounds have high glass transition temperatures, the heat resistance of the element can be improved.

When a configuration, in which an electron transportation layer is provided between the luminescent layer 505 and the cathode (upper electrode 6) in addition to the luminescent layer 505, is adopted, blue emission with high color purity can be achieved in spite of low brightness luminescence.

EXAMPLES

Figure 2:
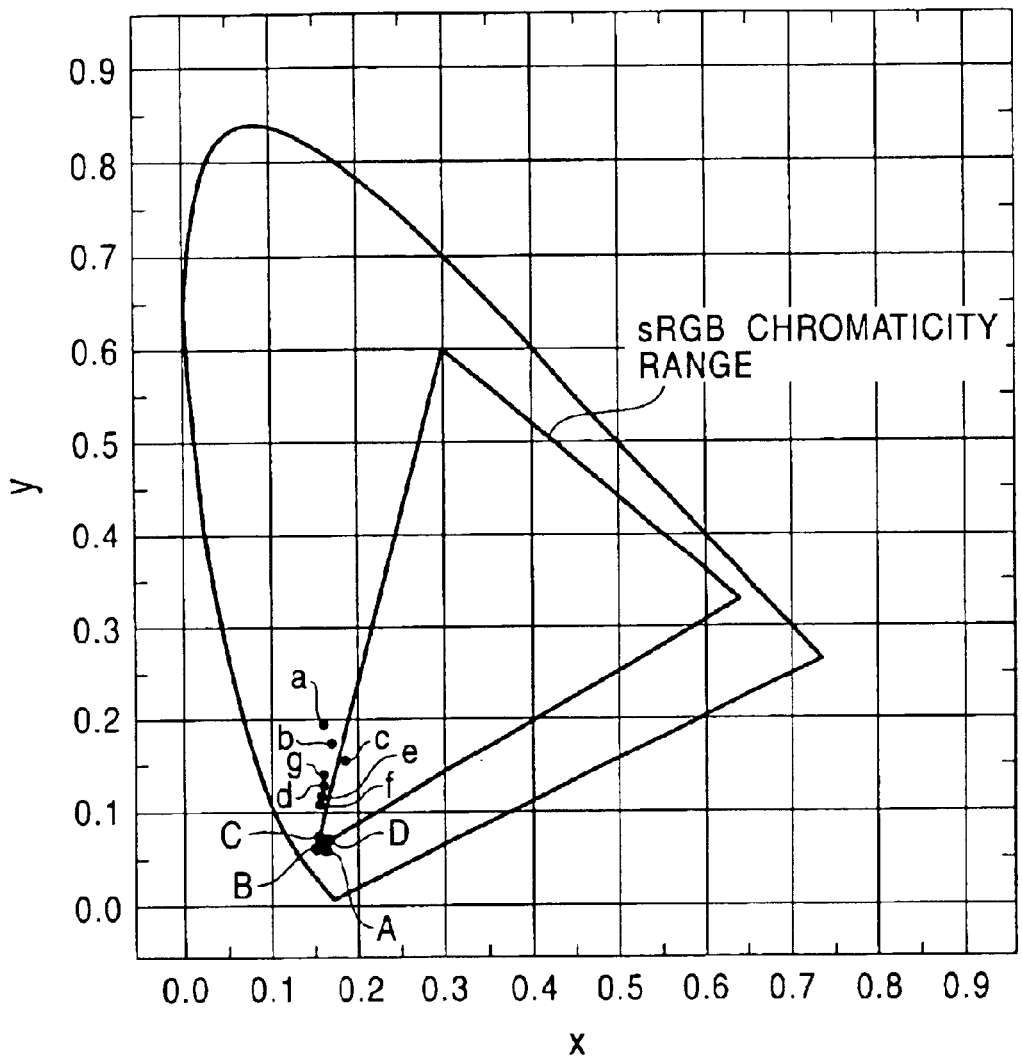
FIG. 2 is a chromaticity diagram showing the chromaticity coordinate of the organic electroluminescent device of each Example and Comparative example.

Specific Examples 1 to 8 according to the present invention, Comparative examples 1 to 4 relative to these Examples, and furthermore, evaluation results thereof will be described below. Herein, regarding organic electroluminescent devices produced in each of Examples and Comparative examples, the chromaticity characteristic, emission spectrum characteristic, and brightness characteristic were evaluated. Regarding the evaluation of each characteristic, a current with a current density of 25 mA/cm$^2$ was passed between the anode and the cathode of the organic electroluminescent device produced, the emitted light taken out thereof was measured with a spectroradiometer (MINOLTA CS-1000) and, therefore, the emission spectrum, chromaticity, and brightness were obtained. The chromaticity measured was shown in the CIE chromaticity diagram in FIG. 2 together with the chromaticity range based on the sRGB, and each emission spectrum is shown in FIG. 3 to FIG. 8.

Each of Examples, Comparative examples, and evaluation results of the characteristics thereof will be described below.

Example 1

Each of layers (1) to (6) having respective film thicknesses as described below was formed on a glass substrate in that order and, therefore, an organic electroluminescent device to become a blue-emitting element was produced. At that time, an anode material (1) was made into a film by sputtering, and thereafter, an insulation film (silicon oxide film) having an opening window for exposing the anode material within the range of 2 mm×2 mm was formed on the substrate. Layers from a hole injection layer (2) to buffer layer (5) were formed on the anode material (1) by vacuum deposition from above a vapor deposition mask. Subsequently, the vapor deposition mask was removed, and a cathode material (6) was laminated on the buffer layer (5) by vacuum deposition.

(1) anode: ITO 190 nm,
(2) hole injection layer: 2-TNATA [4,4',4"-tris(2-naphthylphenylamino)triphenylamine] 20 nm,
(3) hole transportation layer: triphenylamine tetramer represented by the aforementioned Structural formula (2) where R21 to R26=H 50 nm,
(4) luminescent layer having an electron transportation property: a spiro compound [2,2',7,7'-tetrakis(biphenyl)-(9,9'-spirobifluorene] represented by the following Structural formula (1) corresponding to the compound represented by the aforementioned Structural formula (1) where Ar1 to Ar4 are those represented by the aforementioned Structural formula (4) where R1 to R9=H 40 nm, (5) buffer layer: lithium oxide 0.4 nm, and
(6) cathode: aluminum 200 nm.

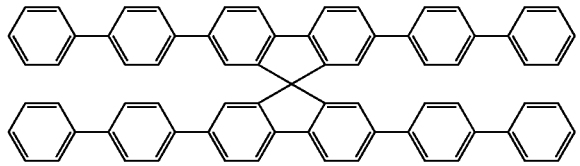

Structural formula (1)

Figure 3:
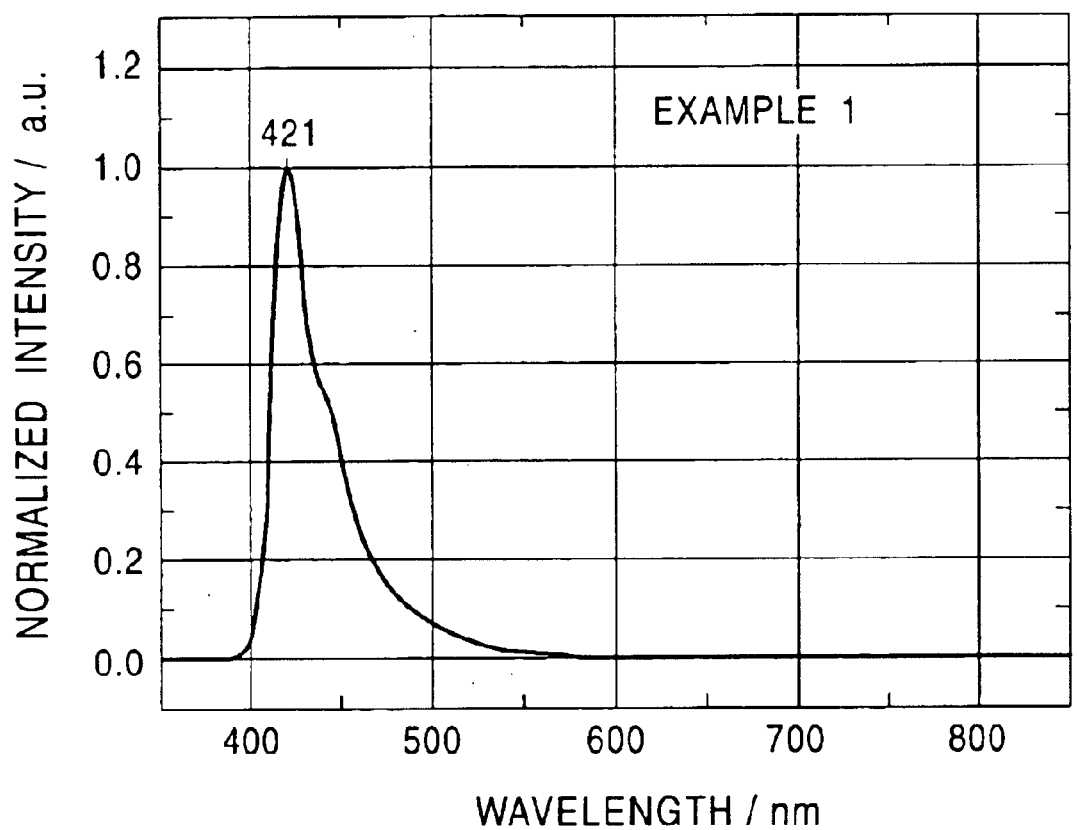
FIG. 3 is the emission diagram of Example 1.

The characteristics of the organic electroluminescent device of Example 1 produced as described above were measured. As a result, the coordinate on the CIE chromaticity coordinates was A(0.16, 0.05) indicated by the point A in the chromaticity diagram shown in FIG. 2, and it was confirmed that the high purity blue emission very close to the blue chromaticity (0.14, 0.07) based on the NTSC standard and blue chromaticity (0.15, 0.06) based on the sRGB could be achieved. As shown in FIG. 3, the emission spectrum had an intense peak at 421 nm, and the full width at half maximum was 34 nm. Furthermore, the brightness at a current density of 25 mA/cm$^2$ was 278 cd/m$^2$ and, therefore, it was confirmed that adequate brightness could be achieved.

Example 2

An organic electroluminescent device was produced in a manner similar to that in Example 1 except that the hole transportation layer (3) shown in Example 1 was formed using triphenylamine tetramer represented by the aforementioned Structural formula (3) where R31 to R36=H with a film thickness of 50 nm.

Figure 4:
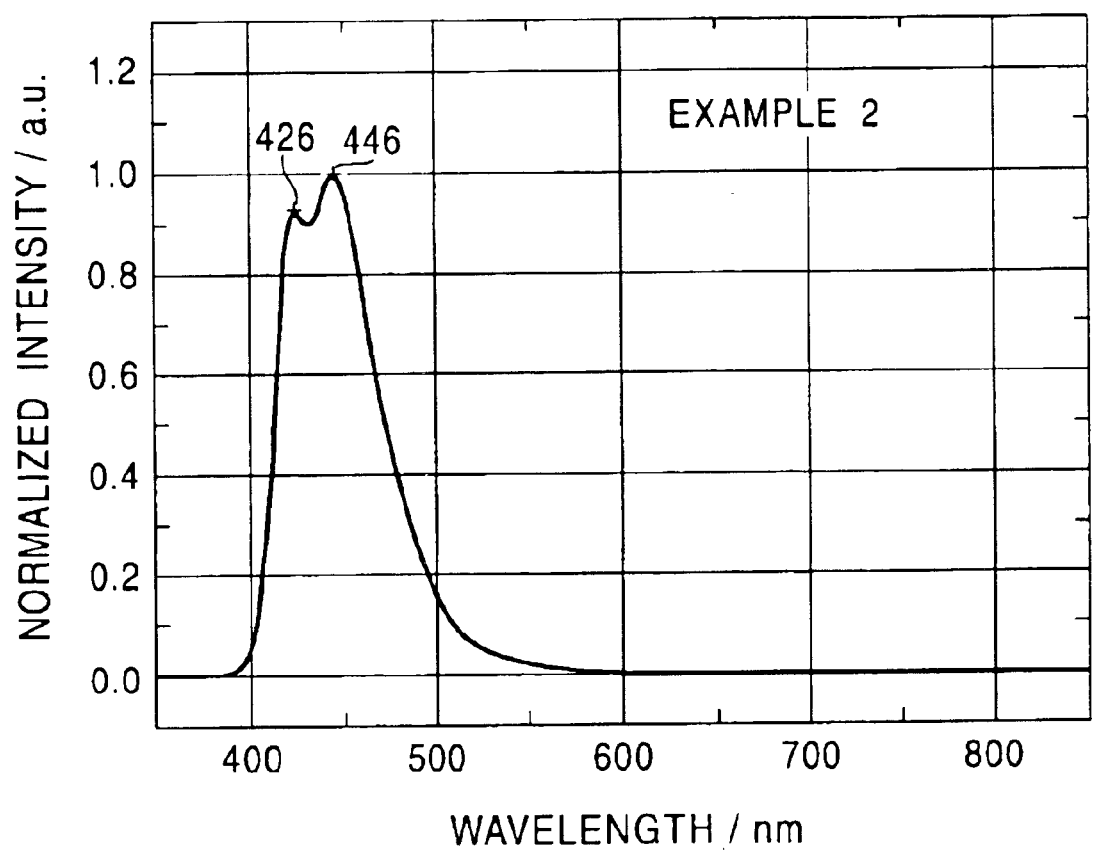
FIG. 4 is the emission diagram of Example 2.

The characteristics of the organic electroluminescent device produced as described above were measured. As a result, the coordinate on the CIE chromaticity coordinates was B(0.15, 0.06) indicated by the point B in the chromaticity diagram shown in FIG. 2, and it was confirmed that the high purity blue emission very close to the blue chromaticity (0.14, 0.07) based on the NTSC standard and blue chromaticity (0.15, 0.06) based on the sRGB could be achieved. As shown in FIG. 4, the emission spectrum had intense peaks at 446 nm and 426 nm, and the full width at half maximum of these peaks was 60 nm. Furthermore, the brightness at a current density of 25 mA/cm$^2$ was 242 cd/m$^2$ and, therefore, it was confirmed that adequate brightness could be achieved.

Comparative Example 1

An organic electroluminescent device was produced in a manner similar to that in Example 1 except that the hole transportation layer (3) in Example 1 was formed using α-NPD (α-naphthylphenyldiamine) that was triphenylamine dimer with a film thickness of 50 nm.

Figure 5:
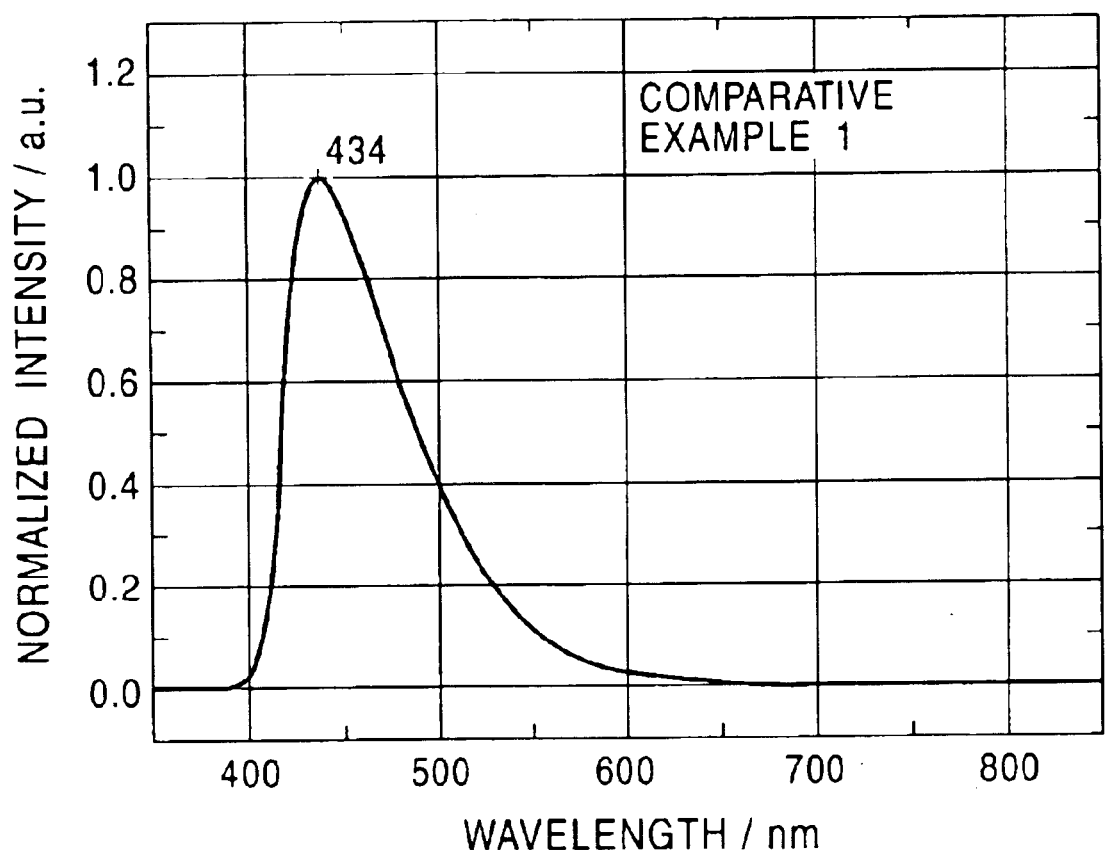
FIG. 5 is the emission diagram of Comparative example 1.

The characteristics of the organic electroluminescent device produced as described above were measured. As a result, the coordinate on the CIE chromaticity coordinates was d(0.16, 0.13) indicated by the point d in the chromaticity diagram shown in FIG. 2, and blue emission was exhibited. However, it was at a considerable distance from the blue chromaticity (0.14, 0.07) based on the NTSC standard and blue chromaticity (0.15, 0.06) based on the sRGB, and the color purity was inadequate. As shown in FIG. 5, the emission spectrum had an intense peak at 434 nm, and the full width at half maximum was 73 nm. Furthermore, the brightness at a current density of 25 mA/cm$^2$ was 284 cd/m$^2$.

Example 3

Each of layers (1) to (7) having respective film thicknesses as described below was formed on a glass substrate in that order and, therefore, an organic electroluminescent device to become a blue-emitting element was produced. At that time, an anode material (1) was made into a film by sputtering, and thereafter, an insulation film (silicon oxide film) having an opening window for exposing the anode material within the range of 2 mm×2 mm was formed on the substrate. Layers from a hole injection layer (2) to buffer layer (6) were formed on the anode material (1) by vacuum deposition from above a vapor deposition mask. Subsequently, the vapor deposition mask was removed, and a cathode material (7) was laminated on the buffer layer material (6) by vacuum deposition.

(1) anode: ITO 190 nm,
(2) hole injection layer: 2-TNATA [4,4',4"-tris(2-naphthylphenylamino)triphenylamine] 20 nm,
(3) hole transportation layer: triphenylamine tetramer represented by the aforementioned Structural formula (2) where R21 to R26=H 50 nm,
(4) luminescent layer: a Spiro compound [2,2',7,7'-tetrakis(biphenyl)-9,9'-spirobifluorene] represented by the following Structural formula (1) corresponding to the compound represented by the aforementioned Structural formula (1) where Ar1 to Ar4 are those represented by the aforementioned Structural formula (4) where R1 to R9=H 30 nm,
(5) electron transportation layer: Alq3 [tris(8-quinolinol)aluminum] 10 nm,
(6) buffer layer: lithium oxide 0.3 nm, and
(7) cathode: aluminum 200 nm.

Structural formula (1)

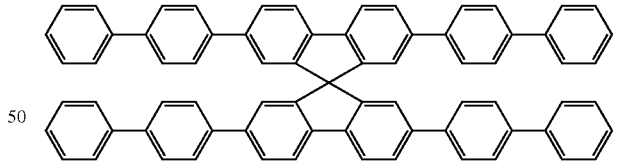

Figure 6:
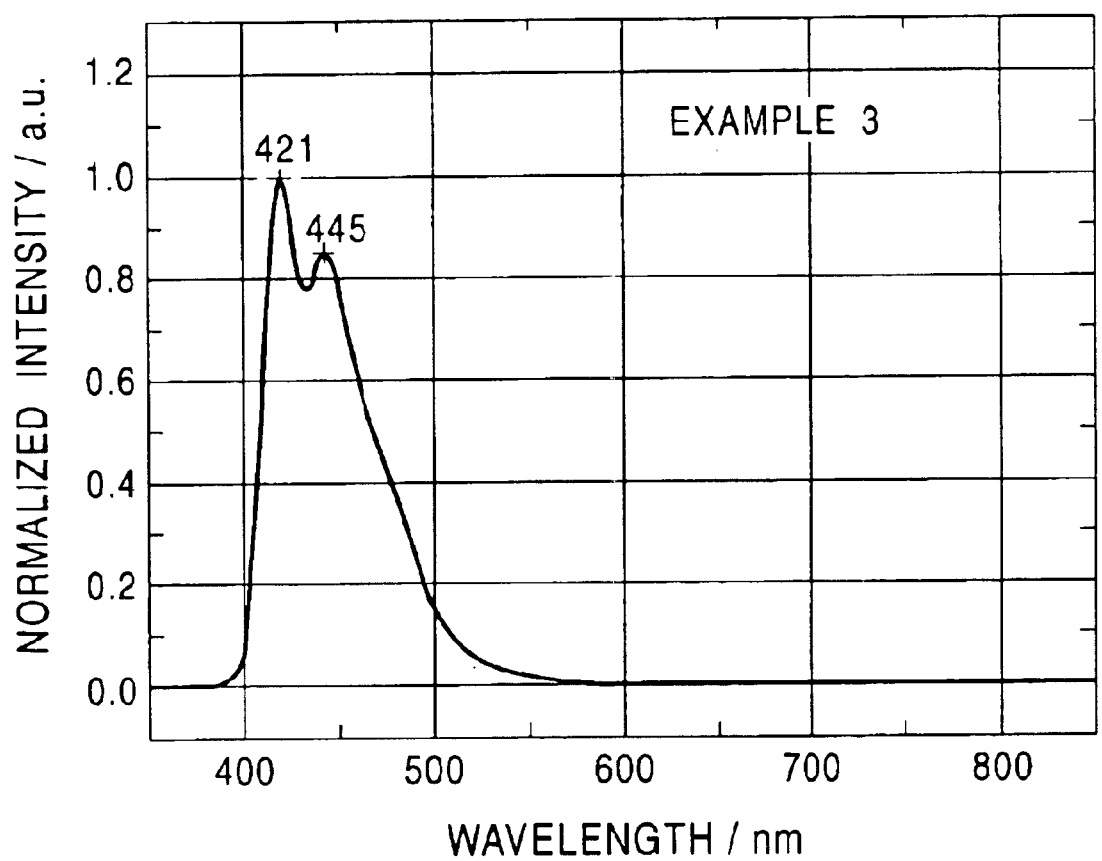
FIG. 6 is the emission diagram of Example 3.

The characteristics of the organic electroluminescent device produced as described above were measured. As a result, the coordinate on the CIE chromaticity coordinates was B(0.15, 0.06) indicated by the point B in the chromaticity diagram shown in FIG. 2, and it was confirmed that the high purity blue emission very close to the blue chromaticity (0.14, 0.07) based on the NTSC standard and blue chromaticity (0.15, 0.06) based on the sRGB could be achieved. As shown in FIG. 6, the emission spectrum had intense peaks at 421 nm and 445 nm, and the full width at half maximum of these peaks was 57 nm. Furthermore, the brightness at a current density of 25 mA/cm$^2$ was 248 cd/m$^2$ and, therefore, it was confirmed that adequate brightness could be achieved.

Example 4

An organic electroluminescent device was produced in a manner similar to that in Example 3 except that the hole transportation layer (3) shown in Example 3 was formed using triphenylamine tetramer represented by the aforementioned Structural formula (3) where R31 to R36=H with a film thickness of 40 nm, and the luminescent layer (4) was formed using a spiro compound [2,2',7,7'-tetrakis(biphenyl)-9,9'-spirobifluorene derivative] represented by the following Structural formula (2) corresponding to the compound represented by the aforementioned Structural formula (1) where Ar1 to Ar4 were those represented by the aforementioned Structural formula (4) where R3=CH₃ and the other R1, R2, etc.,=H with a film thickness of 30 nm.

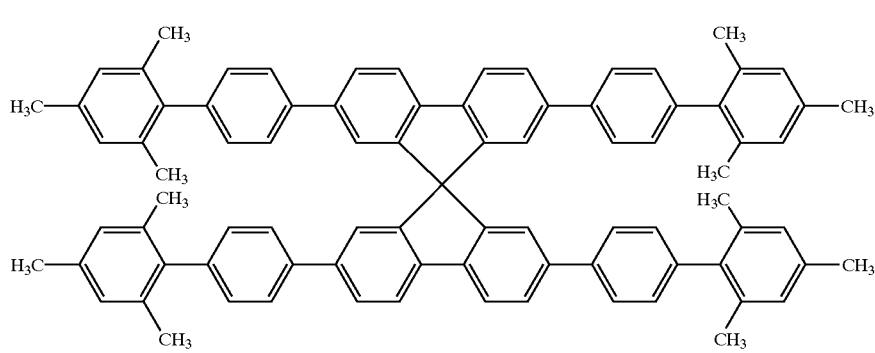

Structural formula (3)

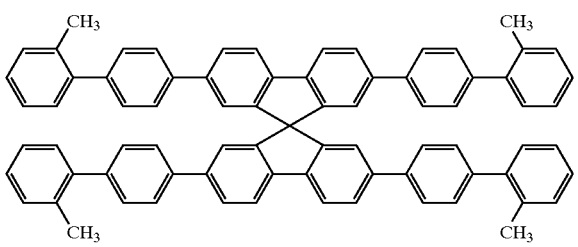

Structural formula (2)

Figure 7:
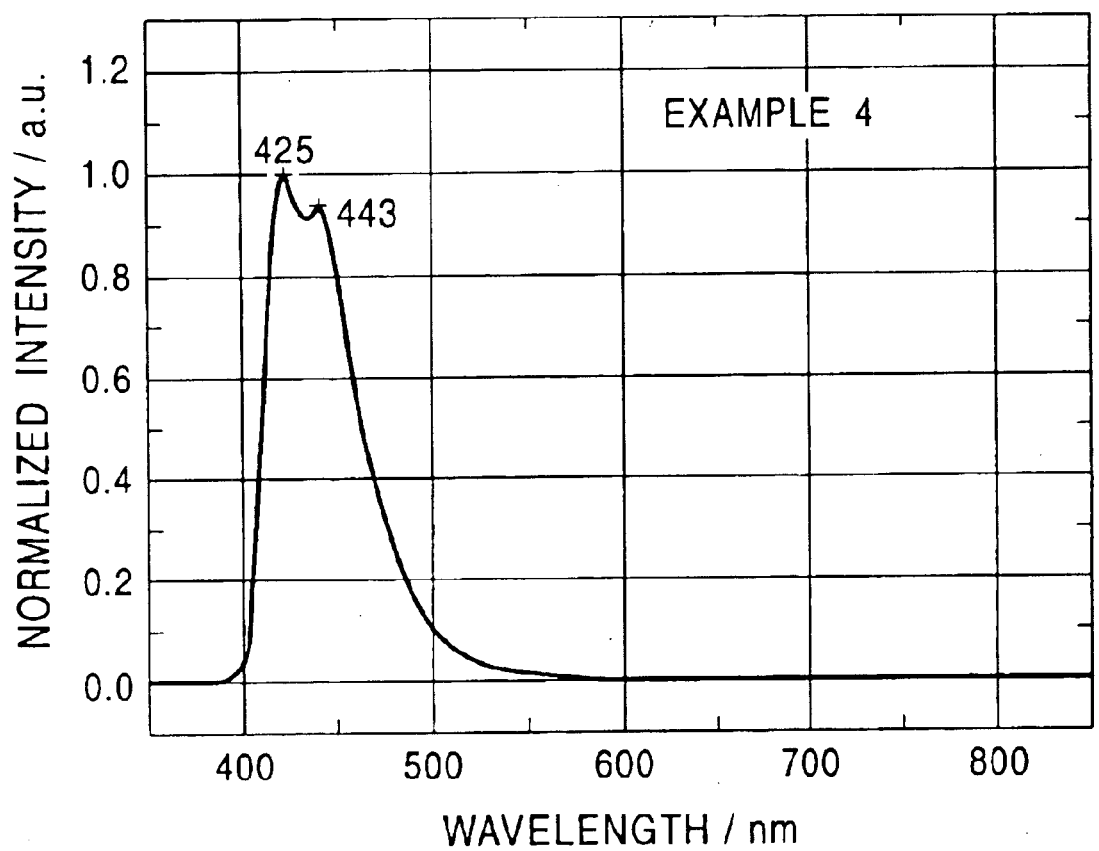
FIG. 7 is the emission diagram of Example 4.

The characteristics of the organic electroluminescent device produced as described above were measured. As a result, the coordinate on the CIE chromaticity coordinates was A(0.16, 0.05) indicated by the point A in the chromaticity diagram shown in FIG. 2, and it was confirmed that the high purity blue emission very close to the blue chromaticity (0.14, 0.07) based on the NTSC standard and blue chromaticity (0.15, 0.06) based on the sRGB could be achieved. As shown in FIG. 7, the emission spectrum had intense peaks at 425 nm and 443 nm, and the full width at half maximum of these peaks was 52 nm. Furthermore, the brightness at a current density of 25 mA/cm² was 76 cd/m².

Example 5

An organic electroluminescent device was produced in a manner similar to that in Example 3 except that the hole transportation layer (3) shown in Example 3 was formed using triphenylamine tetramer represented by the aforementioned Structural formula (3) where R31 to R36=H with a film thickness of 40 nm, and the luminescent layer (4) was formed using a spiro compound [2,2',7,7'-tetrakis(biphenyl)-9,9'-spirobifluorene derivative] represented by the following Structural formula (3) corresponding to the compound represented by the aforementioned Structural formula (1) where Ar1 to Ar4 were those represented by the aforementioned Structural formula (4) where R3, R5, and R7=CH₃ and the other R1, R2, etc., =H with a film thickness of 30 nm.

The characteristics of the organic electroluminescent device produced as described above were measured. As a result, the coordinate on the CIE chromaticity coordinates was C(0.15, 0.07) indicated by the point C in the chromaticity diagram shown in FIG. 2, and it was confirmed that the high purity blue emission very close to the blue chromaticity (0.14, 0.07) based on the NTSC standard and blue chromaticity (0.15, 0.06) based on the sRGB could be achieved. Although not shown in the drawing, the emission spectrum had intense peaks at 424 nm and 444 nm, and the full width at half maximum of these peaks was 58 nm. Furthermore, the brightness at a current density of 25 mA/cm² was 91 cd/m².

Example 6

An organic electroluminescent device was produced in a manner similar to that in Example 3 except that the hole transportation layer (3) shown in Example 3 was formed using triphenylamine tetramer represented by the aforementioned Structural formula (3) where R31 to R36=H with a film thickness of 40 nm, and the luminescent layer (4) was formed using a Spiro compound [2,2',7,7'-tetrakis(biphenyl)-9,9'-spirobifluorene derivative] represented by the following Structural formula (4) corresponding to the compound represented by the aforementioned Structural formula (1) where Ar1 to Ar4 were those represented by the aforementioned Structural formula (4) where R5 was a cyclohexyl group and the other R1, R2, etc., were H with a film thickness of 30 nm.

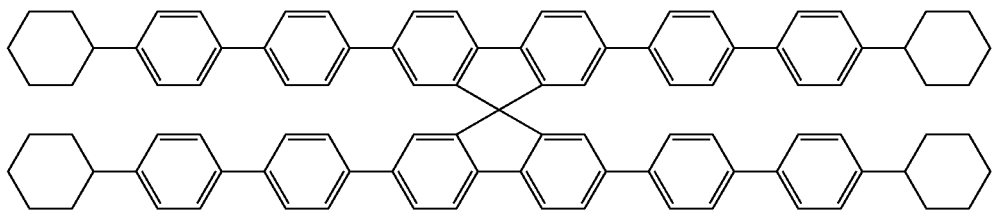
Structural formula (4)

The characteristics of the organic electroluminescent device produced as described above were measured. As a result, the coordinate on the CIE chromaticity coordinates was C(0.15, 0.07) indicated by the point C in the chromaticity diagram shown in FIG. 2, and it was confirmed that the high purity blue emission very close to the blue chromaticity (0.14, 0.07) based on the NTSC standard and blue chromaticity (0.15, 0.06) based on the sRGB could be achieved. Although not shown in the drawing, the emission spectrum had intense peaks at 425 nm and 445 nm, and the full width at half maximum of these peaks was 60 nm. Furthermore, the brightness at a current density of 25 mA/cm² was 151 cd/m².

Comparative Example 2

An organic electroluminescent device was produced in a manner similar to that in Example 3 except that the hole transportation layer (3) in Example 3 was formed using A-NPD (α-naphthylphenyldiamine) that was triphenylamine dimer with a film thickness of 40 nm.

The characteristics of the organic electroluminescent device produced as described above were measured. As a result, the coordinate on the CIE chromaticity coordinates was e(0.16, 0.12) indicated by the point e in the chromaticity diagram shown in FIG. 2, and blue emission was exhibited. However, it was at a considerable distance from the blue chromaticity (0.14, 0.07) based on the NTSC standard and blue chromaticity (0.15, 0.06) based on the sRGB, and the color purity was inadequate. The emission spectrum had an intense peak at 434 nm, and the full width at half maximum was 75 nm. Furthermore, the brightness at a current density of 25 mA/cm² was 355 cd/m².

Example 7

An organic electroluminescent device was produced in a manner similar to that in Example 3 except that the hole transportation layer (3) shown in Example 3 was formed using triphenylamine tetramer represented by the aforementioned Structural formula (3) where R31 to R36=H with a film thickness of 40 nm, and the luminescent layer (4) was formed using a spiro compound [2,2',7,7'-tetrakis(1-naphthyl)-9,9'-spirobifluorene] represented by the following Structural formula (5) corresponding to the compound represented by the aforementioned Structural formula (1) where Ar1 to Ar4 were those represented by the aforementioned Structural formula (5) where R1 to R7=H with a film thickness of 30 nm.

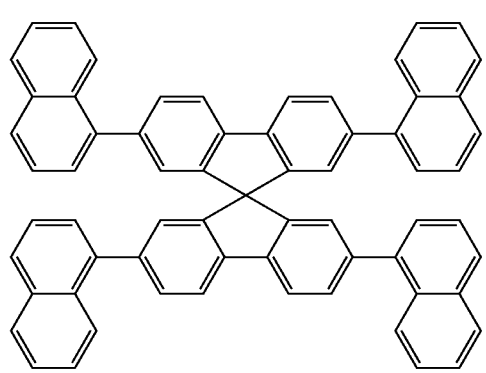
Structural formula (5)

Figure 8:
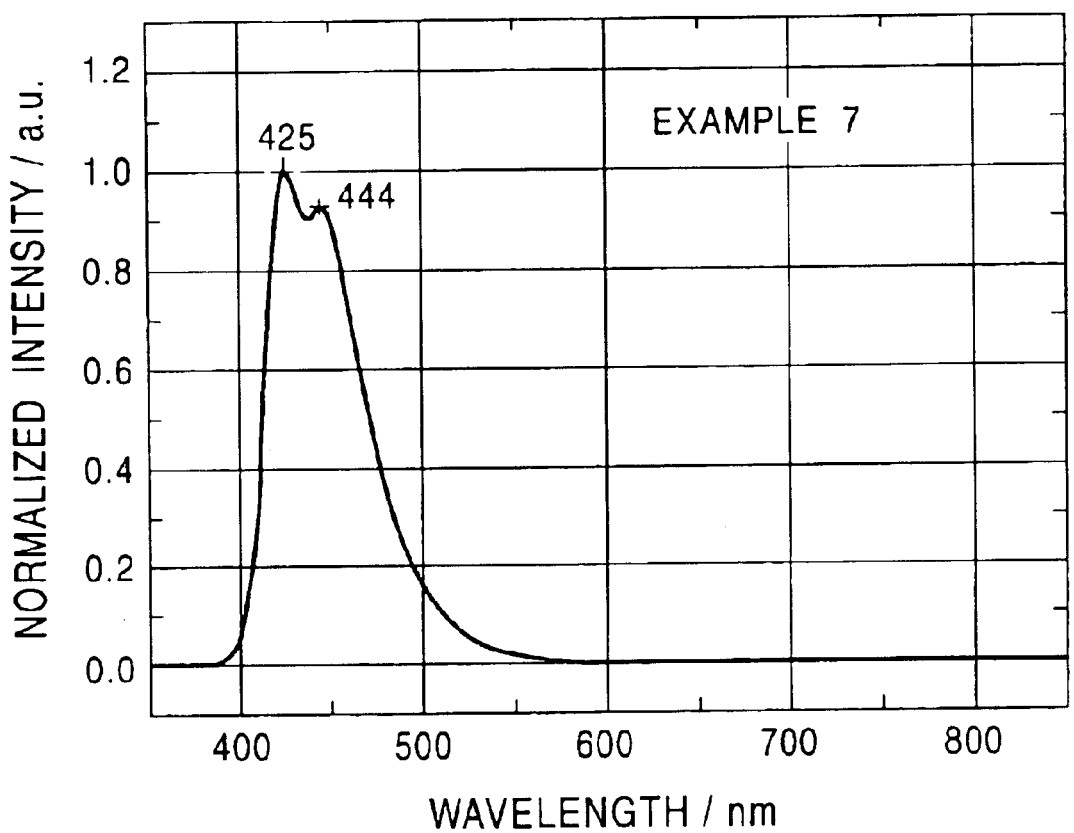
FIG. 8 is the emission diagram of Example 7.

The characteristics of the organic electroluminescent device produced as described above were measured. As a result, the coordinate on the CIE chromaticity coordinates was C(0.15, 0.07) indicated by the point C in the chromaticity diagram shown in FIG. 2, and it was confirmed that the high purity blue emission very close to the blue chromaticity (0.14, 0.07) based on the NTSC standard and blue chromaticity (0.15, 0.06) based on the sRGB could be achieved. As shown in FIG. 8, the emission spectrum had intense peaks at 425 nm and 444 nm, and the full width at half maximum of these peaks was 54 nm. Furthermore, the brightness at a current density of 25 mA/cm² was 46 cd/m².

Comparative Example 3

An organic electroluminescent device was produced in a manner similar to that in Example 7 except that the hole transportation layer (3) in Example 7 was formed using α-NPD (α-naphthylphenyldiamine) that was triphenylamine dimer with a film thickness of 40 nm.

The characteristics of the organic electroluminescent device produced as described above were measured. As a result, the coordinate on the CIE chromaticity coordinates was f(0.16, 0.11) indicated by the point f in the chromaticity diagram shown in FIG. 2, and blue emission was exhibited. However, it was at a considerable distance from the blue chromaticity (0.14, 0.07) based on the NTSC standard and blue chromaticity (0.15, 0.06) based on the sRGB, and the color purity was inadequate. The emission spectrum had an intense peak at 440 nm, and the full width at half maximum was 54 nm. Furthermore, the brightness at a current density of 25 mA/cm² was 65 cd/m².

Example 8

An organic electroluminescent device was produced in a manner similar to that in Example 3 except that the hole transportation layer (3) shown in Example 3 was formed using triphenylamine tetramer represented by the aforementioned Structural formula (3) where R31 to R36=H with a film thickness of 40 nm, and the luminescent layer (4) was formed using a spiro compound [2,2',7,7'-tetrakis(9-(10-phenylanthryl))-9,9'-spirobifluorene] represented by the following Structural formula (6) corresponding to the compound represented by the aforementioned Structural formula (1) where Ar1 to Ar4 were those represented by the aforementioned Structural formula (9) where R5 was a phenyl group and the other R1, R2, etc., were H with a film thickness of 30 nm.

Structural formula (6)

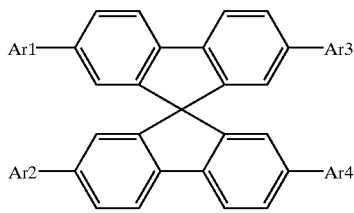

where Ar1 to Ar4 are represented by

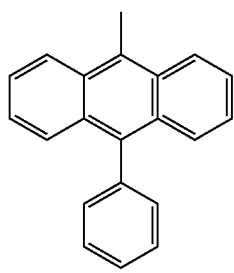

The characteristics of the organic electroluminescent device produced as described above were measured. As a result, the coordinate on the CIE chromaticity coordinates was D(0.16, 0.07) indicated by the point D in the chromaticity diagram shown in FIG. 2, and it was confirmed that the high purity blue emission very close to the blue chromaticity (0.14, 0.07) based on the NTSC standard and blue chromaticity (0.15, 0.06) based on the sRGB could be achieved. Although not shown in the drawing, the emission spectrum had an intense peak at 444 nm, and the full width at half maximum of the peak was 51 nm. Furthermore, the brightness at a current density of 25 mA/cm² was 159 cd/m².

Comparative Example 4

An organic electroluminescent device was produced in a manner similar to that in Example 8 except that the hole transportation layer (3) in Example 8 was formed using α-NPD (α-naphthylphenyldiamine) that was triphenylamine dimer with a film thickness of 40 nm.

The characteristics of the organic electroluminescent device produced as described above were measured. As a result, the coordinate on the CIE chromaticity coordinates was g(0.16, 0.14) indicated by the point g in the chromaticity diagram shown in FIG. 2, and blue emission was exhibited. However, it was at a considerable distance from the blue chromaticity (0.14, 0.07) based on the NTSC standard and blue chromaticity (0.15, 0.06) based on the sRGB, and the color purity was inadequate. Although not shown in the drawing, the emission spectrum had an intense peak at 434 nm, and the full width at half maximum was 89 nm. Furthermore, the brightness at a current density of 25 mA/cm² was 195 cd/m².

As described above, according to the organic electroluminescent device of the present invention, high color purity blue emission which has been hitherto impossible to realize, that is, the high color purity blue emission having an emission color of (0.15±0.01, 0.06±0.01) in the CIE chromaticity diagram and, therefore, very close to the blue chromaticity (0.14, 0.07) based on the NTSC standard and blue chromaticity (0.15, 0.06) based on the sRGB, can be realized.

As a result, regarding the display unit using the aforementioned organic electroluminescent device as the blue-emitting element, display with high color expressivity can be realized by constituting a pixel with a group in which the organic electroluminescent device is combined with a red-emitting element and a green-emitting element.

What is claimed is:
1. An organic electroluminescent device comprising at least a hole transporting layer and a luminescent layer held between an anode and a cathode in a state of lamination in that order from the anode side, wherein:

the luminescent layer comprises a spiro compound represented by the following Structural formula (1) and
the hole transporting layer consists essentially of triphenylamine tetramer represented by the following Structural formula (2) or the following Structural formula (3):

Structural formula (1)

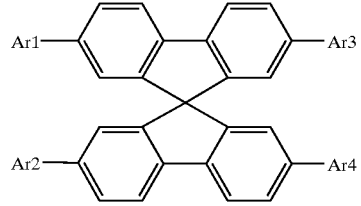

Structural formula (2)

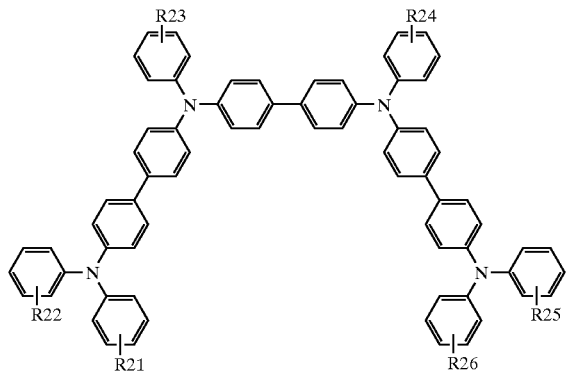

-continued

Structural formula (3)

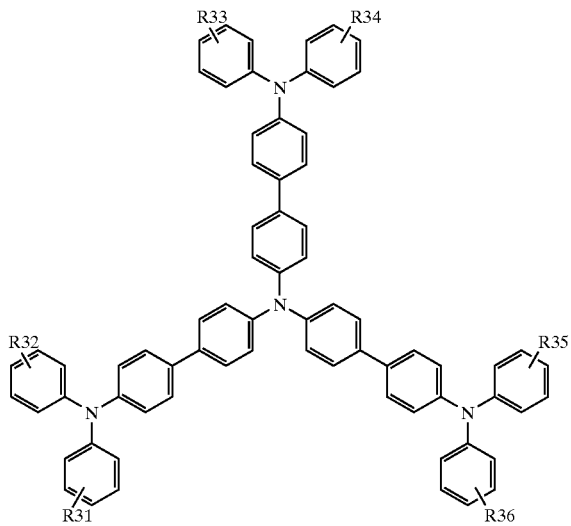

where Ar1 to Ar4 in the Structural formula (1) independently represent a biphenyl group, a substituted biphenyl group, a naphthyl group, a substituted naphthyl group, an anthryl group, or a substituted anthxyl group, and R21 to R26 in the Structural formula (2) and R31 to R36 in the Structural formula (3) independently represent a hydrogen, an alkyl group having the number of carbon atoms of 1 to 12, a cycloalkyl group, an aryl group having the number of carbon atoms of 5 to 28, or a substituted aryl group.

2. The organic electroluminescent device according to claim 1, wherein at least one of Ar1 to Ar4 in the Structural formula (1) is a biphenyl group or a substituted biphenyl group represented by the following Structural formula (4):

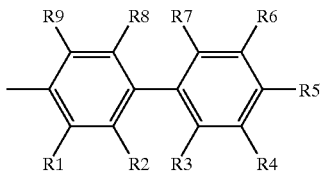

Structural formula (4)

where R1 to R9 in the Structural formula (4) independently represent a hydrogen, an alkyl group having the number of carbon atoms of 1 to 12, a cycloalkyl group, an aryl group having the number of carbon atoms of 5 to 28, or a substituted aryl group.

3. The organic electroluminescent device according to claim 1, wherein at least one of Ar1 to Ar4 in the Structural formula (1) is a naphthyl group or a substituted naphthyl group represented by the following Structural formula (5) or Structural formula (6):

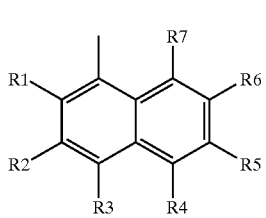

Structural formula (5)

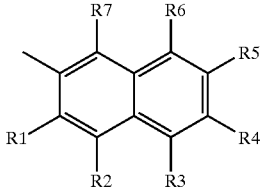

Structural formula (6)

where R1 to R7 in the Structural formula (5) and Structural formula (6) independently represent a hydrogen, an alkyl group having the number of carbon atoms of 1 to 12, a cycloalkyl group, an aryl group having the number of carbon atoms of 5 to 28, or a substituted aryl group.

4. The organic electroluminescent device according to claim 1, wherein at least one Ar1 to Ar4 in the Structural formula (1) is an anthryl group or a substituted anthryl group represented by the following Structural formula (7), Structural formula (8), or Structural formula (9):

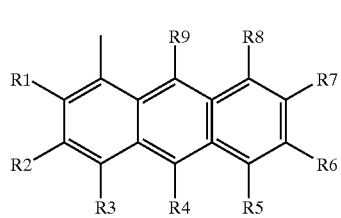

Structural formula (7)

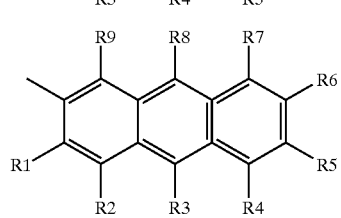

Structural formula (8)

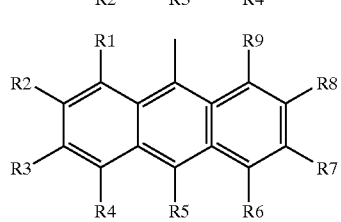

Structural formula (9)

where R1 to R9 in the Structural formula (7), Structural formula (8), and Structural formula (9) independently represent a hydrogen, an alkyl group having the number of carbon atoms of 1 to 12, a cycloalkyl group, an aryl group having the number of carbon atoms of 5 to 28, or a substituted aryl group.

5. The organic electroluminescent device according to claim 1, wherein an electron transporting layer is provided between the cathode and the luminescent layer.

6. The organic electroluminescent device according to claim 1, wherein, at least one of the anode and cathode comprises a light transmissive material.

7. The organic electroluminescent device according to claim 1, wherein the cathode comprises a light transmissive material.

8. The organic electroluminescent device according to claim 7, wherein the cathode comprises an alloy of magnesium and silver.

9. A display unit comprising a plurality of pixels formed by arraying organic electroluminescent devices comprising at least a hole transporting layer and a luminescent layer held between an anode and a cathode in a state of lamination in that order from the anode side, wherein:
  the luminescent layer comprises a spiro compound represented by the following Structural formula (1) or a derivative thereof; and
  the hole transporting layer consists essentially of triphenylamine tetramer represented by the following Structural formula (2) or the following Structural formula (3):

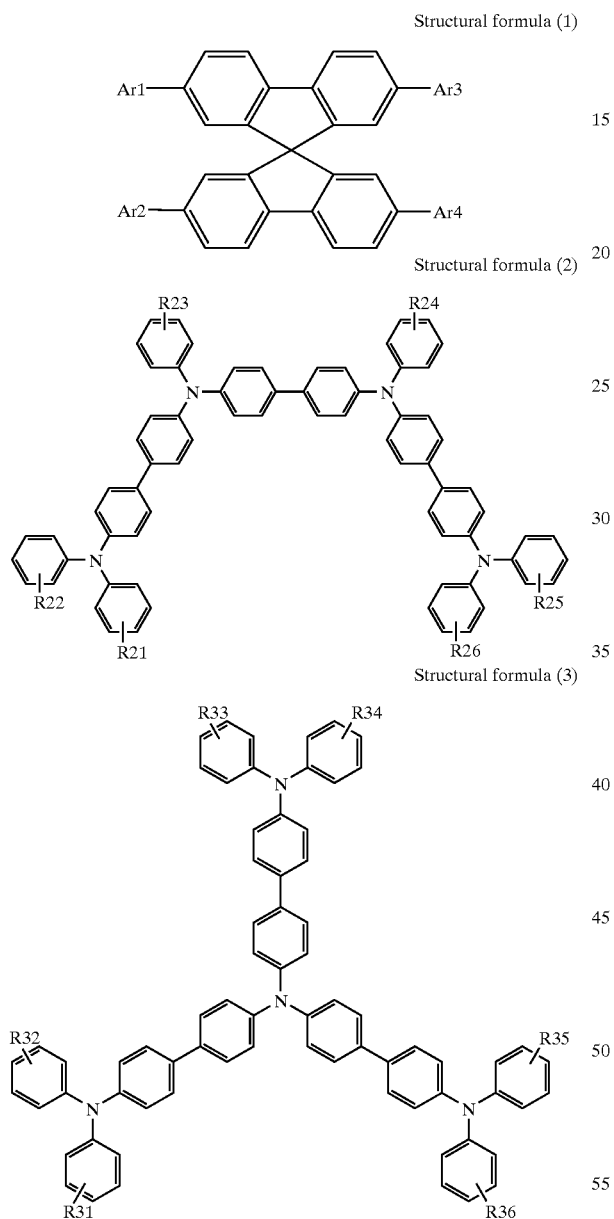

where Ar1 to Ar4 in the Structural formula (1) independently represent a biphenyl group, a substituted biphenyl group, a naphthyl group, a substituted naphthyl group, an anthryl group, or a substituted anthryl group, and R21 to R26 in the Structural formula (2) and R31 to R36 in the Structural formula (3) independently represent a hydrogen, an alkyl group having the number of carbon atoms of 1 to 12, a cycloalkyl group, an aryl group having the number of carbon atoms of 5 to 28, or substituted aryl group.

10. The display unit according to claim 9, wherein at least one of Ar1 to Ar4 in the Structural formula (1) is a biphenyl group or a substituted biphenyl group represented by the following Structural formula (4):

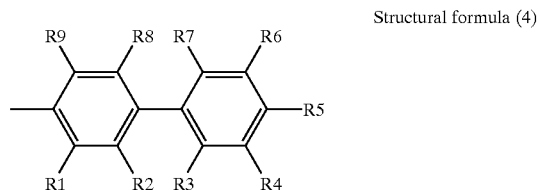

where R1 to R9 in the Structural formula (4) independently represent a hydrogen, an alkyl group having the number of carbon atoms of 1 to 12, a cycloalkyl group, an aryl group having the number of carbon atoms of 5 to 28, or a substituted aryl group.

11. The display unit according to claim 9, wherein at least one of Ar1 to Ar4 in the Structural formula (1) is a naphthyl group or a substituted naphthyl group represented by the following Structural formula (5) or Structural formula (6):

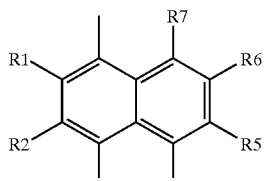

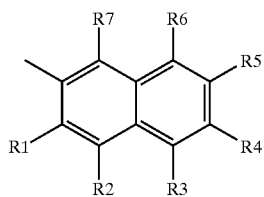

where R1 to R7 in the Structural formula (5) and Structural formula (6) independently represent a hydrogen, an alkyl group having the number of carbon atoms of 1 to 12, a cycloalkyl group, an aryl group having the number of carbon atoms of 5 to 28, or a substituted aryl group.

12. The display unit according to claim 9, wherein at least one of Ar1 to Ar4 in the Structural formula (1) is an anthryl group or a substituted anthryl group represented by the following Structural formula (7), Structural formula (8), or Structural formula (9):

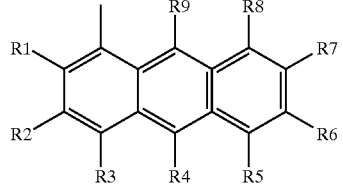

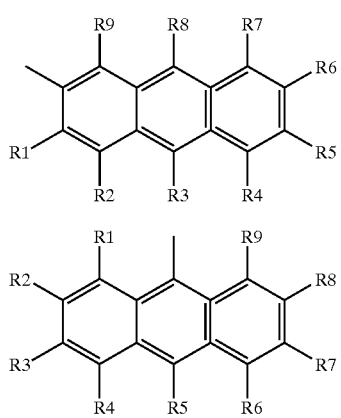

Structural formula (8)

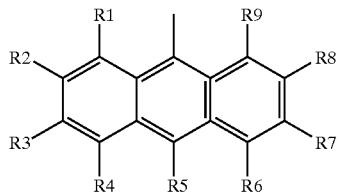

Structural formula (9)

where R1 to R9 in the structural formula (7), Structural formula (8), and Structural formula (9) independently represent a hydrogen, an alkyl group having the number of carbon atoms of 1 to 12, a cycloalkyl group, an aryl group having the number of carbon atoms of 5 to 28, or a substituted aryl group.

13. The display unit according to claim 9, wherein the organic electroluminescent devices are provided at a part of the plurality of pixels as blue-emitting elements.

14. The display unit according to claim 9, wherein an electron transporting layer is provided between the cathode and the luminescent layer.

15. The display unit according to claim 9, wherein at least one of the anode and cathode comprises a light transmissive material.

16. The display unit according to claim 9, wherein the cathode comprises a light transmissive material.

17. The display unit according to claim 16, wherein the cathode comprises an alloy of magnesium and silver.

* * * * *